US00RE33947E

United States Patent [19]

Shinohara

[11] E Patent Number: Re. 33,947

[45] Reissued Date of Patent: Jun. 2, 1992

[54] LASER SCRIBING METHOD

[75] Inventor: Hisato Shinohara, Sagamihara, Japan

[73] Assignee: Semiconductor Energy Laboratory Co., Ltd., Kanagawa, Japan

[21] Appl. No.: 608,397

[22] Filed: Nov. 2, 1990

Related U.S. Patent Documents

Reissue of:

[64] Patent No.: 4,865,686
Issued: Sep. 12, 1989
Appl. No.: 188,766
Filed: May 3, 1988

U.S. Applications:

[62] Division of Ser. No. 97,190, Sep. 16, 1987, Pat. No. 4,861,964.

[30] Foreign Application Priority Data

Sep. 26, 1986 [JP] Japan ..... 61-229252

[51] Int. Cl.[5] ..... B44C 1/22; C03C 15/00; C03C 25/06

[52] U.S. Cl. ..... 156/643; 156/656; 156/667; 156/901; 219/121.69; 219/121.85

[58] Field of Search ..... 156/643, 654, 655, 656, 156/657, 662, 666, 901, 345; 204/192.24; 427/53.1, 62, 63; 505/728, 816, 820; 219/121.65, 121.68, 121.69, 121.75, 121.85

[56] References Cited

U.S. PATENT DOCUMENTS 4,341,565 7/1982 Yaron et al. ..... 219/121.65
4,468,551 8/1984 Neiheisel ..... 219/121.75 X
4,713,518 12/1987 Yamazaki et al. ..... 219/121.75 X
4,786,358 11/1988 Yamazaki et al. ..... 156/656 X

FOREIGN PATENT DOCUMENTS 57-94482 6/1982 Japan ..... 219/121.75

*Primary Examiner*—William A. Powell
*Attorney, Agent, or Firm*—Sixbey, Friedman, Leedom & Ferguson

[57] ABSTRACT

A laser scribing system and method is described. In the system, a film formed on a substrate is irradiated with laser beam which is focused on a limited portion of the film in order to remove the portion and produce a groove. Laser beam used for eliminating the portion of film formed on a substrate is deprived of its border portion in advance of the focusing. Sperical aberration is suppressed due to this elimination.

10 Claims, 4 Drawing Sheets

LASER SCRIBING METHOD

Matter enclosed in heavy brackets [ ] appears in the original patent but forms no part of this reissue specification; matter printed in italics indicates the additions made by reissue.

This is *a reissue of application Ser. No. 07/188,766, filed May 3, 1988, now U.S. Pat. No. 4,865,686 which is* a divisional application of Ser. No. 097,190, filed Sep. 16, 1987, *now U.S. Pat. No. 4,861,964.*

BACKGROUND OF THE INVENTION

This invention relates to laser scribing system and method.

Besides photolithography, laser processing is well-known to process transparent conductive film which are used for liquid crystal device. YAG lasers have been used as laser beam sources in such a laser processing, the wave length being 1.06 microns for example. In such a laser processing, a groove is formed by continuously irradiation of a sequence of spot-shaped laser beams in the form of a line prescribed in a substrate to be processed. Because of this, the process condition, such as the energy density of a laser beam, the scanning speed, and so forth must be controlled in accordance with the characteristics of the transparent conductive film to be processed such as thermal conductivity. For this reason, it is difficult to improve the yield of product, when commercialized in mass-production, without compromising the specification of the product. Further, the laser energy 1.23 eV per photon which corresponds to the wavelength of 1.06 microns, is very small as compared with 3 to 4 eV which represents an energy gap range of a usual transparent conductive film, such as tin oxide, indium oxide, indium tin oxide, zinc oxide, or the like. Still further, in a laser processing using Q-switching operation, laser beams have to scan at 30 to 60 cm/min with 0.5 to 1 W per spot of laser beam which has 50 microns in sectional diameter, 40 mm in focal distance, 3 KHz in pulse frequency and 60 namo seconds in pulse width. Due to such a high energy, cracking may cause on an underlying layer on which the transparent conductive layer has been formed and make the device defective. The damage of the underlying surface is caused in the shapes of scales.

In addition, with a prior art laser processing, a number of fine grooves can not be formed with 10 to 50 microns in interval, and etching must be implemented after laser processing because the imperfect formation of grooves. Further, the lasing condition must be monitored for each process to comply with the fluctuation of the output of the laser, especially the fluctuation at an initial output power. This invention is an improvement of Japanese Patent Application No. Sho 59-211,769.

SUMMARY OF THE INVENTION

It is therefore an object of the invention to provide a laser scribing system and a laser scribing method capable of removing a portion of a film completely on a substrate without damaging the underlying surface.

It is therefore an object of the invention to provide a laser scribing system and a laser scribing method in which spherical aberration is suppressed.

In order to accomplish the above objects, a laser scribing system makes use of a flat-shaped laser beam with its cross section having 20 to 200 microns, e.g., 150 microns in width and 10 to 60 cm, e.g., 30 cm in length, with which a line on a substrate to be processed is simultaneously irradiated and scribed. Preferably, the laser beam has less than 400 nm in wavelength and is pulsed with a pulse width less than 50 namo meters. By means of such a pulsed laser beam, optical energy absorption efficiency is enhanced by a factor of more than 100 and, eventually the process time is shortened by a factor of more than 10, as compared with prior art.

Further, in accordance with the invention, a border portion of the laser beam is taken away so that the effect of spherical aberration is limited. Because of this, the edge of a processed portion on the substrate becomes clear and a sharp boundary can be obtained, even if a groove is desired to be formed on a substrate with 30 cm in length and 10 to 30 microns, e.g., 20 microns in width.

DETAILED DESCRIPTION OF THE PREFERRED EMBODIMENT

Figure 1:
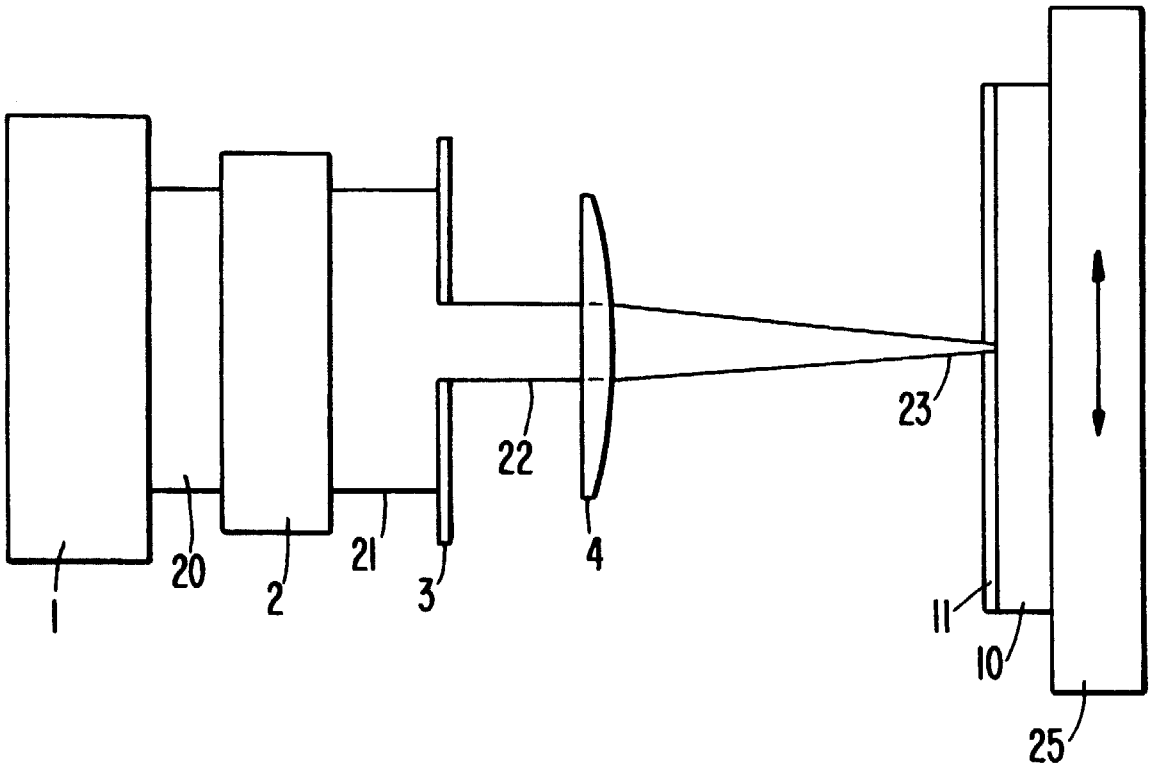
FIG. 1 is a cross section view of a laser scribing system in accordance with the present invention.
Figure 2A:
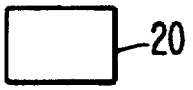
FIGS. 2(A) to 2(D) are explanatory views showing the cross sections of laser beam.
Figure 2B:
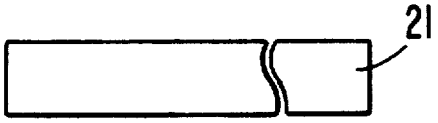
Figure 2C:
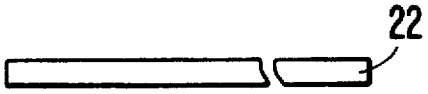
Figure 2D:
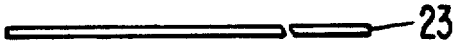

Referring to FIG. 1, a laser processing system is illustrated. In the figure, the system comprises a substrate holder and a laser radiating system. The laser radiating system consists of an eximer laser 1 (KrF) distributed by Questec Inc. (wavelength=248 nm; energy gap=5.0 eV), an expander 2, a slit 3 and a cylindrical lense 4. A laser beam 20 emitted from the laser 1 having a cross section of 16 mm×20 mm with a power density of $5.6\times10^{-2}$mJ/mm$^2$ (FIG. 2(A)) is expanded by the expander 2 with respect to the direction perpendicular to the drawing sheet of FIG. 1. The expanded laser beam 21 having a cross section of 16 mm×300 mm (FIG. 2(B)) is deprived of its periphery (border) by means of the slit 3. The deprived laser beam 22 having a cross section of 2 mm×300 mm (FIG. 2(C)) is focused on a transparent conductive film 11, such as a tin oxide film (energy gap=3.5 eV) formed on a substrate 10 which is mounted on a base 25. The width of the laser beam on the film 11 is 20 microns. The base 25 can be moved in X and Y directions so that the laser beam can be focused on the desired position.

The width of the slit 3 is determined in accordance with the case. However, the width must be chosen so that the laser beam can focused to the width in which spherical aberration can be neglected. Namely the performance of the lense indirectly determines the width of focused laser beam. The pulse width of the laser beam is less than 50 namo second, e.g., 20 namo seconds and the repetition frequency is 1-100 Hz, e.g., 10 Hz. According to experimental, a perfect groove was formed on a fifth-layered transparent film by laser scribing with pulsed laser beams at 10 Hz/pulse, and a plurality of separated parts of the film were produced with 20 microns in width and 15 mm in interval only within the process time of 0.8 minute. After ultrasonic-cleaning, the underlying surface was not damaged. It took only 5 to 10 minutes to complete the whole process.

Figure 3A:
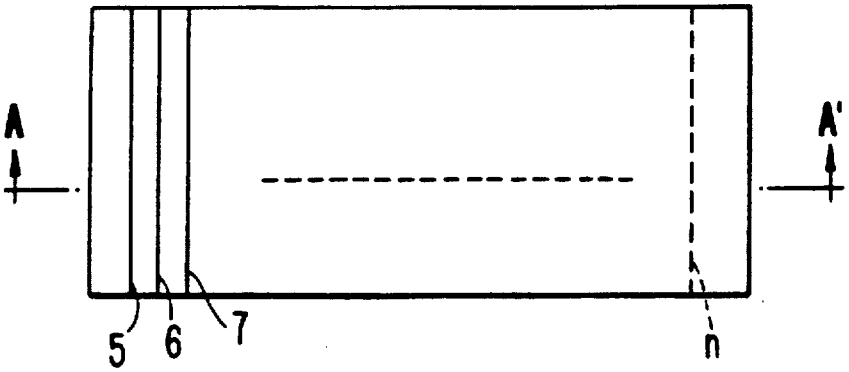
FIGS. 3(A) and 3(B) are a plan view and a side view of a substrate processed in accordance with the invention.
Figure 3B:
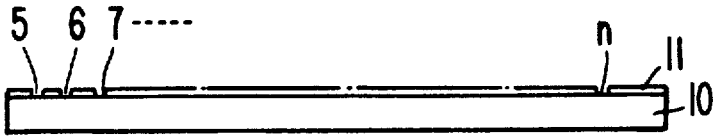

The formation of groove can be repeatedly carried out while a substrate to be processed is periodically moved in the direction perpendicular to the groove. By this method, a plurality of grooves are formed in parallel with 30 cm in length and 20 microns in width at the interval of 400 micron respectively, as shown in FIG. 3. Namely, the substrate is shifted to the perpendicular direction by 15 mm after each irradiation of one pulse of laser beam. Of course, by selectively shifting the substrate on which adjacent irradiation portions are arranged with no interval, a plurality of strips with 20 microns in width at 400 microns interval in between can be formed.

By the similar process to the above experiment, a non-single crystalline semiconductor film doped with hydrogen or fluorine was formed with 1000 Å in thickness on a substrate. The film was severed into a plurality of parts by laser scribing with pulsed laser beams having a wavelength of less than 400 nm with 10 namo seconds in pulse width and 2.3 $mJ/mm^2$ in average output power. The underlying surface was not damaged.

Figure 4A:
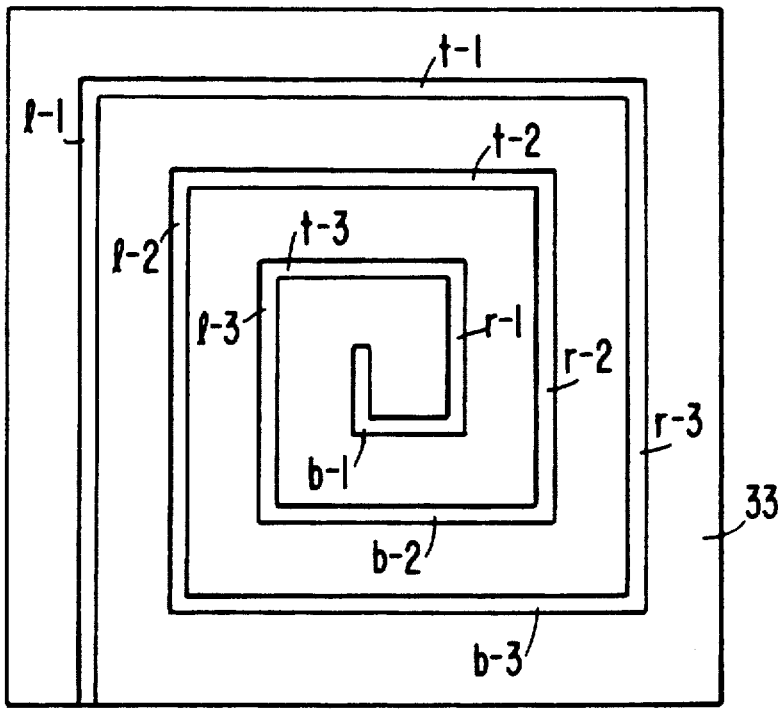
FIGS. 4(A) and 4(B) are plan and section view showing another embodiment of the present invention.
Figure 4B:
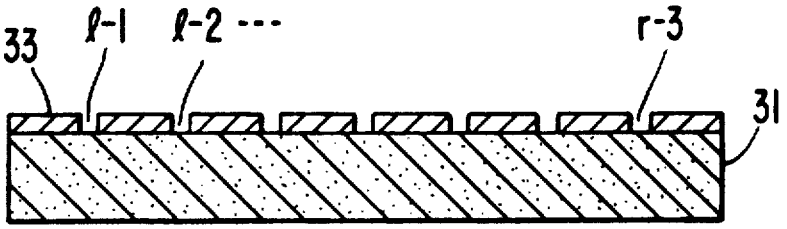

Referring to FIGS. 4(A) and 4(B), another embodiment is illustrated. In this embodiment, a superconducting coil is manufactured. On the (100) plane of a substrate 31 made of magnesium oxide (MgO), a superconducting film with the (001) plane is formed. The superconducting film is made of a ceramic generally expressed by a molecular formula; $ABCu_3O_{6-8}$, where A stands for one or more rare earth element and B stands for one or more alkali earth metal, e.g., $YBa_2Cu_3O_{6-8}$. By the similar process as explained in the description of the preceding embodiment, a number of grooves 1-1, 1-2, 1-3, r-1, r-2, r-3, t-1, t-2, t-3, b-1, b-2 and b-3 are formed. In so doing, obturating means such as a pair of screens to change the length of the laser beam in cross section by eliminating the ends thereof has to be provided between the laser 1 and the expander 2, or between the expander 2 and the slit 3. Namely, after forming the groove l-1, the length of the laser beam is shortened by the elimination and scribes the groove l-2. And, by the same manner, remaining grooves aligned in the same direction are formed in sequence. Then the substrate 31 is turned by 90°, and the grooves t-1 to b-3 are scribed. As a result, a superconducting coil is manufactured in the form of a spiral coil.

The invention should not be limited to the above particular embodiments and many modifications and variations may cause to those skilled in the art. For example, there may be provided, between the beam expander and the surface to be processed, an integrater, a condensing lense, a projection lense and so forth in order to make the optical system more precise.

I claim:

1. A method for scribing a film formed on a substrate comprising:

expanding a laser beam from an eximer laser;

eliminating a border portion from the expanded laser beam;

focusing the laser beam shaped by the elimination on said substrate and removing the irradiated portion of said film.

2. The method of claim 1 wherein said eximer laser emitted from said eximer laser has less than 400 namo meters in wavelength.

3. The method of claim 2 wherein said film is severed into a plurality of separated parts by grooves which are formed by removing corresponding portions of said film.

4. The method of claim 2 wherein the expanding step is carried out only in one direction.

5. The method of claim 4 wherein the expanded laser beam is focused with respect to the direction perpendicular to the expanding direction.

6. The method of claim 5 wherein the focusing step is carried out repeatedly on said substrate while said substrate is shifted to the focusing direction, so that a plurality of grooves are formed on said substrate.

7. The method of claim 1 wherein said laser beam is pulsed.

8. The method of claim 7 wherein the pulse width of the pulsed laser beam is less than 50 namo seconds.

9. The method of claim 1 where said expanding step is mainly implemented with respect to one direction and the laser beam deprived of the border portion becomes a flat beam having a line in cross section.

10. The method of claim 1 further comprising a step of eliminating the edge portions of said laser beam having a line in cross section.

* * * * *